United States Patent
Butzmann

(10) Patent No.: US 9,329,241 B2
(45) Date of Patent: May 3, 2016

(54) DEVICE AND METHOD FOR MEASURING A MINIMUM CELL VOLTAGE

(75) Inventor: Stefan Butzmann, Beilstein (DE)

(73) Assignee: Robert Bosch GmbH, Stuttgart, DE (US)

( * ) Notice: Subject to any disclaimer, the term of this patent is extended or adjusted under 35 U.S.C. 154(b) by 291 days.

(21) Appl. No.: 14/129,830

(22) PCT Filed: Jul. 9, 2012

(86) PCT No.: PCT/EP2012/063382
§ 371 (c)(1),
(2), (4) Date: Apr. 7, 2014

(87) PCT Pub. No.: WO2013/010843
PCT Pub. Date: Jan. 24, 2013

(65) Prior Publication Data
US 2014/0225623 A1    Aug. 14, 2014

(30) Foreign Application Priority Data
Jul. 19, 2011    (DE) .......................... 10 2011 079 363

(51) Int. Cl.
*G01R 31/36* (2006.01)
*G01R 19/00* (2006.01)
*H01M 10/48* (2006.01)
(Continued)

(52) U.S. Cl.
CPC ........ *G01R 31/3658* (2013.01); *G01R 19/0038* (2013.01); *G01R 31/362* (2013.01); *H01M 10/482* (2013.01); *G01R 1/203* (2013.01); *G01R 19/16542* (2013.01); *H01M 10/0525* (2013.01);
(Continued)

(58) Field of Classification Search
CPC .................................................. G01R 731/3658
See application file for complete search history.

(56) References Cited

U.S. PATENT DOCUMENTS

2007/0164710 A1    7/2007    Sato
2009/0130542 A1    5/2009    Mizoguchi et al.
(Continued)

FOREIGN PATENT DOCUMENTS

DE    10 2008 043 921 A1    5/2010
EP    1 933 443 A2    6/2008
(Continued)

OTHER PUBLICATIONS

Atsushi,Imai and Hiroshi, Tamura-Abnormality detecting device of Battery pack, Jun. 29, 2011—Translation.*
(Continued)

*Primary Examiner* — Drew A Dunn
*Assistant Examiner* — Tynese McDaniel
(74) *Attorney, Agent, or Firm* — Maginot, Moore & Beck LLP

(57) ABSTRACT

A device for measuring a minimum cell voltage among cell voltages of a plurality of battery cells connected in series includes a plurality of ohmic resistors connected in series. The device is configured to be connected to a plurality of battery cells connected in series in such a way that a respective battery cell of the plurality of battery cells is associated with each ohmic resistor of the plurality of ohmic resistors according to the series connections. Each ohmic resistor of the plurality of ohmic resistors, with the exception of a first ohmic resistor, is configured to conduct the smaller of a current that corresponds to the cell voltage of the associated battery cell and the current that is conducted by a preceding ohmic resistor in the series connection.

11 Claims, 3 Drawing Sheets

(51) Int. Cl.
  *G01R 1/20* (2006.01)
  *G01R 19/165* (2006.01)
  *H01M 10/0525* (2010.01)

(52) U.S. Cl.
  CPC ......... *H01M 2220/20* (2013.01); *Y02T 10/7011* (2013.01)

(56) References Cited

U.S. PATENT DOCUMENTS

2010/0239896 A1    9/2010  Kanno
2011/0012605 A1*   1/2011  Lyles ............... G01R 19/16542
                                                            324/433

FOREIGN PATENT DOCUMENTS

JP    2001-174531 A    6/2001
JP      2001174531  *  6/2001  ......... G01R 31/3658

OTHER PUBLICATIONS

International Search Report corresponding to PCT Application No. PCT/EP2012/063382, mailed Oct. 25, 2012 (German and English language document) (5 pages).

* cited by examiner

DEVICE AND METHOD FOR MEASURING A MINIMUM CELL VOLTAGE

This application is a 35 U.S.C. §371 National Stage Application of PCT/EP2012/063382, filed on Jul. 9, 2012, which claims the benefit of priority to Serial No. DE 10 2011 079 363.1, filed on Jul. 19, 2011 in Germany, the disclosures of which are incorporated herein by reference in their entirety.

The present disclosure relates to a device and a method for measuring the minimum cell voltage among the cell voltages of a plurality of series-connected battery cells, and a battery management unit having a device of this type, a battery having a device of this type or a battery management unit of this type, and a motor vehicle having a battery of this type.

BACKGROUND

It is apparent that in the future, both in the case of stationary applications (for example in the case of wind energy plants) and also in vehicles such as hybrid and electric vehicles, new battery systems will be used ever more frequently and extremely high demands in relation to reliability will be placed on said battery systems. The background to these high demands is that a failure of the battery can lead to a failure of the entire system or even to a safety-related problem. By way of example, batteries are thus installed in the case of wind energy plants in order to protect the plant in a strong wind from unacceptable operating conditions by way of a rotor blade adjustment.

Typically nowadays in the case of lithium ion batteries, the voltage of each cell is individually monitored in order to be able to protect the latter against exhaustive discharge. Typically, a non-generic integrated circuit having multiplexers and analogue/digital converters is used for this purpose, which integrated circuit is in communication with a control unit. This solution is complex and expensive.

FIG. 1 illustrates the principle of such monitoring of an individual cell in accordance with the prior art. A battery management unit 10 comprises an integrated circuit 14 that is electrically connected to each of the battery cells 12a, 12b, . . . , 12n of a battery. The integrated circuit 14 comprises a multiplexer and an analogue/digital converter and is connected to a control unit 18 by way of a communication bus 16.

A device for measuring electrical cell voltages is disclosed in DE 10 2008 043 921 A1, in which each storage cell comprises an allocated measuring device and the individual measurement values are read out on the basis of a read instruction of a control unit.

SUMMARY

In accordance with the disclosure, a device for measuring the minimum cell voltage among the cell voltages of a plurality of series-connected battery cells is provided, wherein the device comprises a plurality of series-connected ohmic resistors, wherein the device can be connected to a plurality of series-connected battery cells in such a manner that a battery cell is allocated to each ohmic resistor according to the series connections, wherein a first ohmic resistor that precedes all of the other ohmic resistors in the series connection is embodied for the purpose of conducting a current that corresponds to the cell voltage of the allocated battery cell, and wherein each ohmic resistor with the exception of the first ohmic resistor is embodied to conduct whichever is the smaller current: either the current that corresponds to the cell voltage of the allocated battery cell or the current that is conducted by the series-connected preceding ohmic resistor.

It is preferred that each of the ohmic resistors comprises the same resistance value R. The current that corresponds to a cell voltage U is preferably given as $(U-\Delta U)/R$, wherein $\Delta U$ is a predefined voltage.

In a preferred embodiment, the device comprises in addition to each of the plurality of ohmic resistors an associated transistor and an associated reference voltage source and in addition to each of the plurality of ohmic resistors with the exception of the first resistor an associated diode, wherein in each case the cathode of each diode can be connected to the positive pole of a battery cell that is allocated to the associated ohmic resistor, the anode of each diode is connected to a first connector of the associated ohmic resistor, a second connector of each ohmic resistor is connected to a first connector of the associated transistor, the base connector of each transistor is connected to the positive pole of the associated reference voltage source, the negative pole of each reference voltage source can be connected to the negative pole of a battery cell that is allocated to the associated ohmic resistor, a first connector of the first ohmic resistor can be connected to the positive pole of the allocated battery cell and the first connector of each ohmic resistor with the exception of the first ohmic resistor is connected to a second connector of the transistor that is associated with the series-connected preceding ohmic resistor. The reference voltage sources are preferably embodied in each case to provide the same reference voltage, and the predefined voltage $\Delta U$ is given by way of this reference voltage.

The device can be connected to a plurality of series-connected battery cells in such a manner that a battery cell is allocated to each ohmic resistor according to the series connections. The battery cells are preferably lithium ion battery cells.

There is also provided in accordance with the disclosure, a battery management unit having a device in accordance with the disclosure, a battery having a device in accordance with the disclosure or a battery management system in accordance with the disclosure and a motor vehicle, in particular an electric motor vehicle, having a battery in accordance with the disclosure.

Furthermore, the disclosure provides a method for measuring the minimum cell voltage among the cell voltages of a plurality of series-connected battery cells, wherein a first current is produced, which first current corresponds to the cell voltage of a first battery cell, which battery cell precedes all other battery cells in the series connection, and wherein further currents are produced, wherein each further current is allocated to a battery cell and wherein each further current is whichever is the smaller current: either a current that corresponds to the cell voltage of the allocated battery cell or the current that is allocated to the battery cell that precedes the allocated battery cell in the series connection.

Advantageous developments of the disclosure are disclosed in the dependent claims and the description.

BRIEF DESCRIPTION OF THE DRAWINGS

Exemplary embodiments of the disclosure are further described with reference to the drawings and the following description. In the drawings.

DETAILED DESCRIPTION

Figure 1:
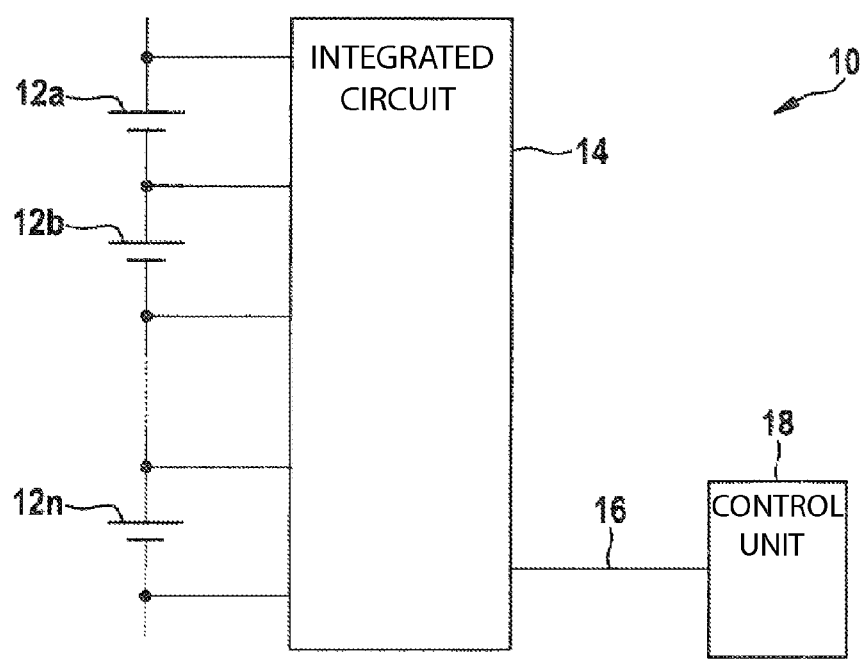
FIG. 1 illustrates a circuit diagram of a device for individually monitoring the voltage of battery cells in accordance with the prior art.
Figure 2:
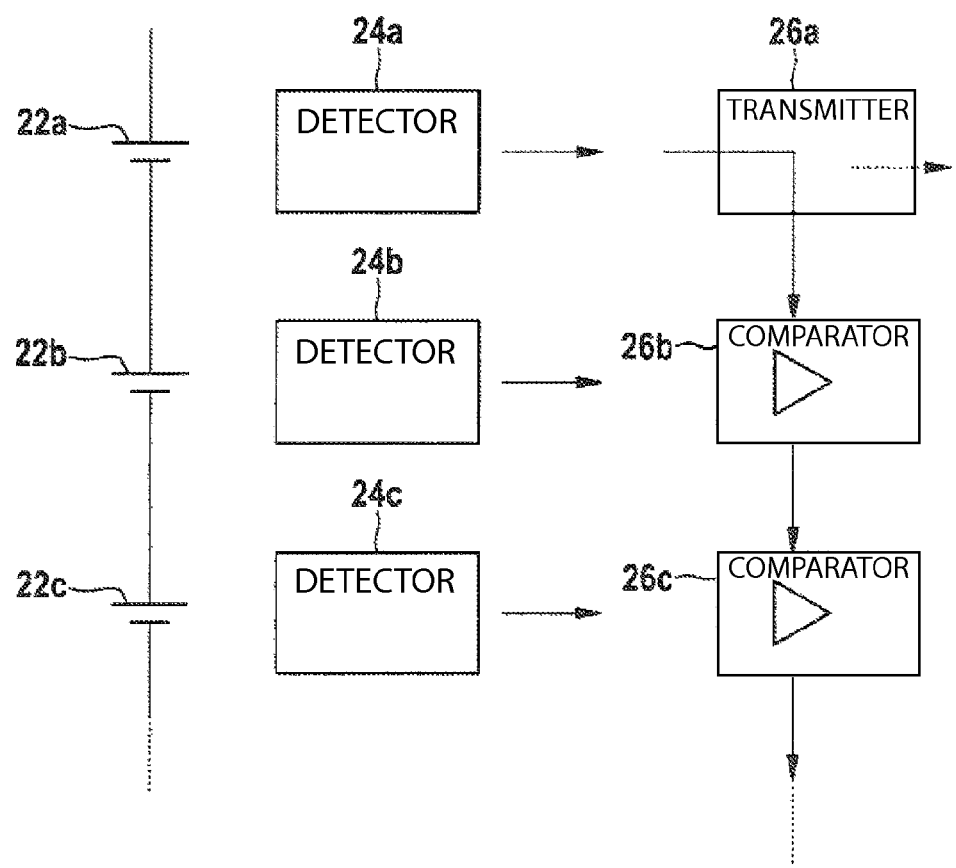
FIG. 2 illustrates a diagram for representing the principle of the disclosure.

FIG. 2 illustrates the principle according to which in accordance with the disclosure the minimum cell voltage among the cell voltages of a plurality of series-connected battery cells is ascertained. The battery to be monitored comprises a series of battery cells $22a$, $22b$, $22c$, .... The cell voltage of the battery cell $22a$ is detected in a detection step $24a$. In step $26a$, the cell voltage that is detected is transmitted onwards unchanged; this step only relates to the first of the battery cells. The cell voltage of the battery cell $22b$ is detected in a detection step $24b$. In a comparison step $26b$, the detected cell voltage of the battery cell $22b$ is compared with the cell voltage that has been transmitted onwards in step $26a$ and the smaller of the two voltages is output. Likewise, the cell voltage of the battery cell $22c$ is detected in a detection step $24c$, and in a comparison step $26c$ the detected cell voltage of the battery cell $22c$ is compared with the cell voltage that was output in step $26b$ and the smaller of the two voltages is output. The smallest of the cell voltages of all battery cells $22a$, $22b$, $22c$, ... is determined by way of continuing this method for all battery cells.

Figure 3:
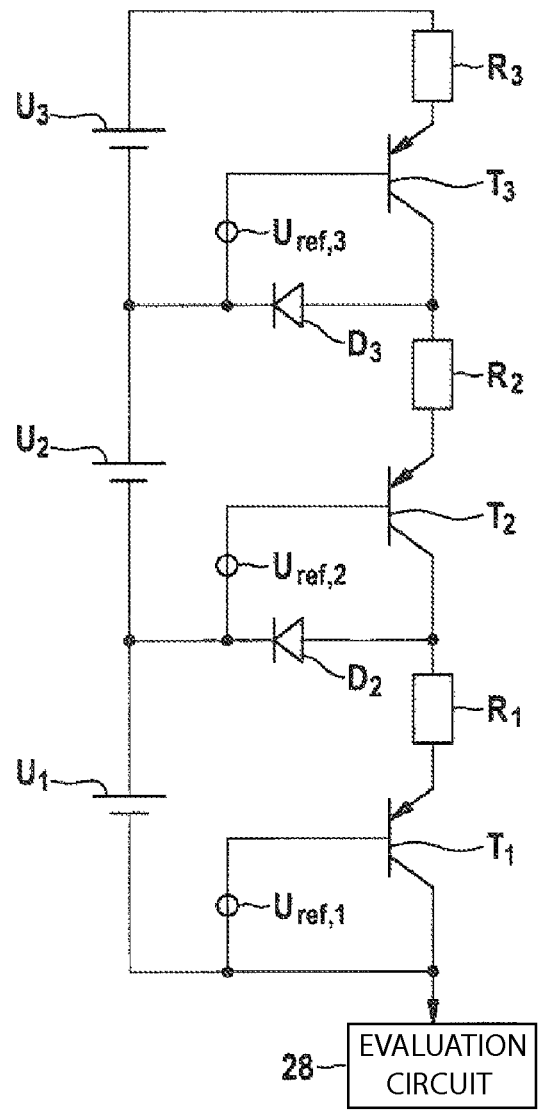
FIG. 3 illustrates an exemplary embodiment of a device in accordance with the disclosure for measuring a minimum cell voltage.

FIG. 3 illustrates an exemplary embodiment of a device in accordance with the disclosure for measuring the minimum cell voltage among the cell voltages of a plurality of series-connected battery cells. In this exemplary embodiment the series connection comprises three battery cells; the disclosure is, however, not limited to this number of battery cells. The cell voltages $U_1$, $U_2$, $U_3$ are tapped by way of diodes $D_2$ and $D_3$ that are considered as idealized diodes having infinitesimal forward voltage drop. By means of ohmic resistors $R_1$, $R_2$, $R_3$ and transistors $T_1$, $T_2$, $T_3$, the cell voltages in each case are compared with the reference voltage sources $U_{ref,1}$, $U_{ref,2}$, $U_{ref,3}$, wherein the transistors $T_1$, $T_2$, $T_3$ are regarded as idealized transistors, for example PNP-Transistors having infinitesimal base emitter voltage drop. The term 'base emitter voltage of a transistor' is understood to refer to the relevant voltage that prevails between the base and the emitter of the transistor if a current flows between the emitter and the collector; this voltage is approximately independent of the current that is flowing between the emitter and the collector. Ideally, all of the ohmic resistors $R_1$, $R_2$, $R_3$ have the same resistance value R, and all of the reference voltage sources $U_{ref,1}$, $U_{ref,2}$, $U_{ref,3}$ provide the same voltage $U_{ref}$.

In the case of the described idealized characteristics of the components, the voltage $U_3-U_{ref}$ is applied to the ohmic resistor $R_3$, so that a current $I_3=(U_3-U_{ref})/R$ flows. This current flows onwards by way of the ohmic resistor $R_2$, so that at said resistor at most the voltage $R\,I_3=U_3-U_{ref}$ drops off. If this voltage is smaller than the difference $U_2-U_{ref}$ then the diode $D_3$ becomes non-conductive, and only the current $I_2=I_3$ flows by way of the ohmic resistor. However, if the voltage is greater, in other words, amounting to $U_3-U_{ref}>U_2-U_{ref}$ and therefore $U_2<U_3$, then the diode $D_3$ becomes conductive, and the voltage $U_2-U_{ref}$ prevails at the ohmic resistor $R_2$, so that a current $I_2=(U_2-U_{ref})/R$ flows. In both cases, a current $I_2$ consequently flows, which current corresponds to the smaller of the two currents $U_2$ and $U_3$, in other words $I_2=(min(U_2, U_3)-U_{ref})/R$.

The same applies for the diode $D_2$ and the ohmic resistor $R_1$, so that the current $I_1=(min(U_1, min(U_2, U_3))-U_{ref})/R = (min(U_1, U_2, U_3)-U_{ref})/R$ flows by way of the ohmic resistor $R_1$ and the voltage $min(U_1, U_2, U_3)-U_{ref}$ drops off at said ohmic resistor. The current through $T_1$ that corresponds to the minimum cell voltage $min(U_1, U_2, U_3)$, can be evaluated by means of an evaluation circuit 28.

Figure 4:
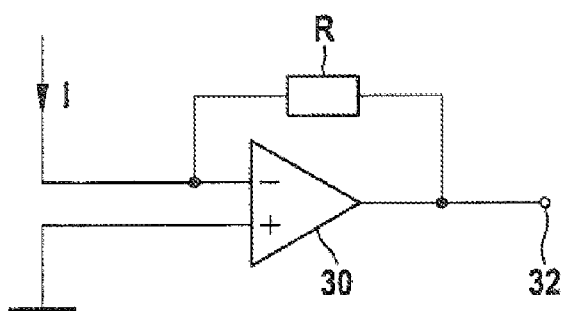
FIG. 4 illustrates an exemplary embodiment of an evaluation circuit for the device shown in FIG. 3.

FIG. 4 illustrates an exemplary embodiment of an evaluation circuit of this type. The current I that is to be evaluated is supplied to the inverting input of an operational amplifier 30 that is subject to negative feedback current by way of an ohmic resistor R. The non-inverting input of the operational amplifier 30 is earthed, and the output of the operational amplifier 30 is connected to a connector 32 and the measuring signal can be read out on said connector.

In a further embodiment of the disclosure, the idealized components can be replaced by way of active rectifier circuits and amplifying circuits in order to achieve the described behavior.

The device described above can be used as a part of a battery management unit that monitors the minimum cell voltage of the battery cells of a battery and prevents exhaustive discharge of the battery cells. A battery management unit of this type can be used as a part of a battery, in particular of a battery that is used in a motor vehicle.

The invention claimed is:

1. A device for measuring a minimum cell voltage among cell voltages of a plurality of series-connected battery cells, comprising:
   a plurality of series-connected ohmic resistors,
   wherein the device is configured to be connected to the plurality of series-connected battery cells in such a manner that each battery cell of the plurality of series-connected battery cells is provided with an ohmic resistor of the plurality of series-connected ohmic resistors,
   wherein a first ohmic resistor that precedes all of the other ohmic resistors in the plurality of series-connected ohmic resistors is configured to conduct a current that corresponds to a cell voltage of the battery cell of the plurality of series-connected battery cells that is provided with said first ohmic resistor, and
   wherein each ohmic resistor of the plurality of series-connected ohmic resistors, with the exception of said first ohmic resistor, is configured to conduct whichever current is smaller of either (i) a current that corresponds to a cell voltage of a preceding battery cell, or (ii) a current that corresponds to a cell voltage of the battery cell provided with said ohmic resistor.

2. The device as claimed in claim 1, wherein each ohmic resistor of the plurality of series-connected ohmic resistors has the same resistance value.

3. The device as claimed in claim 2, wherein:
   the current which corresponds to the cell voltage is given as $(U-\Delta U)/R$,
   $\Delta U$ is a predefined voltage,
   U is the cell voltage of each battery cell, and
   R is the resistance value of each ohmic resistor of the plurality of series-connected ohmic resistors.

4. The device as claimed in claim 3, wherein:
   each ohmic resistor is provided with an associated transistor, an associated reference voltage source, and with the exception of said first ohmic resistor, an associated diode,
   a cathode of each associated diode is configured to be connected to a positive pole of a battery cell that is provided with said associated diode's ohmic resistor,
   an anode of each associated diode is connected to a first connector of its corresponding ohmic resistor, a second connector of each ohmic resistor is connected to a first connector of its associated transistor, a base connector of each associated transistor is connected to a positive pole of the associated reference voltage source provided to its corresponding ohmic resistor, a negative pole of each associated reference voltage source is configured to be connected to a negative pole of a battery cell that is provided with its corresponding ohmic resistor, a first connector of said first ohmic resistor is configured to be connected to the positive pole of the allocated battery cell and the first connector of each ohmic resistor with the exception of said first ohmic resistor is connected to a second connector of an associated transistor of a preceding ohmic resistor.

5. The device as claimed in claim 4, wherein:

each associated the reference voltage source is configured to provide the same reference voltage, and said predefined voltage is defined by said reference voltage source.

6. The device as claimed in claim 4, further comprising:

an evaluation circuit including an operational amplifier that is subject to negative feedback current via an ohmic resistor of the plurality of series-connected ohmic resistors, wherein an inverting input of the operational amplifier is connected to the second connector of the associated transistor provided with the last series-connected ohmic resistor, wherein a non-inverting input of the operational amplifier is earthed, and wherein an output of the operational amplifier is connected to a test port.

7. The device as claimed in claim 1, wherein the device is connected to the plurality of series-connected battery cells in such a manner that each battery cell of the plurality of series-connected battery cells is provided with an ohmic resistor of the plurality of series-connected ohmic resistors.

8. The device as claimed in claim 7, wherein the device is included in a battery management unit.

9. The device as claimed in claim 8, wherein the battery management unit is included in a battery.

10. An electric motor vehicle, comprising:

a battery including a battery management unit having a device for measuring a minimum cell voltage among cell voltages of a plurality of series-connected battery cells, the device including a plurality of series-connected ohmic resistors, wherein the device is configured to be connected to the plurality of series-connected battery cells in such a manner, that each a battery cell of the plurality of series-connected battery cells is provided with an ohmic resistor of the plurality of series-connected ohmic resistors, wherein a first ohmic resistor that precedes all of the other ohmic resistors in the plurality of series-connected ohmic resistors is configured to conduct a current that corresponds to a cell voltage of the battery cell of the plurality of series-connected battery cells that is provided with said first ohmic resistor, and wherein each ohmic resistor of the plurality of series-connected ohmic resistors, with the exception of said first ohmic resistor, is configured to conduct whichever current is smaller of either (i) a current that corresponds to a cell voltage of a preceding battery cell, or (ii) a current that corresponds to a cell voltage of the battery cell provided with said ohmic resistor.

11. A method for measuring a minimum cell voltage among cell voltages of a plurality of series-connected battery cells, comprising:

first producing a first current that corresponds to a cell voltage of a first battery cell that precedes all other battery cells in the plurality of series-connected battery cells; and then for all other battery cells in the plurality of series-connected battery cells, producing a current that corresponds to a cell voltage associated with the battery cell, wherein each current with the exception of said first current is whichever is the smaller current of either (i) a current that corresponds to a cell voltage of a preceding battery cell, or (ii) the current that corresponds to the cell voltage associated with the battery cell in the plurality of series-connected battery cells.

* * * * *